(12) United States Patent
Johari-Galle et al.

(10) Patent No.: US 9,676,614 B2
(45) Date of Patent: Jun. 13, 2017

(54) MEMS DEVICE WITH STRESS RELIEF STRUCTURES

(71) Applicant: Analog Devices, Inc., Norwood, MA (US)

(72) Inventors: Houri Johari-Galle, Sunnyvale, CA (US); Michael W. Judy, Ipswich, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 13/757,217

(22) Filed: Feb. 1, 2013

(65) Prior Publication Data

US 2014/0217521 A1   Aug. 7, 2014

(51) Int. Cl.
H01L 29/84 (2006.01)
B81C 1/00 (2006.01)
B81B 3/00 (2006.01)
B81B 7/00 (2006.01)

(52) U.S. Cl.
CPC ........ *B81C 1/00134* (2013.01); *B81B 3/0072* (2013.01); *B81B 7/0048* (2013.01); *B81C 2203/0785* (2013.01)

(58) Field of Classification Search
CPC ...... B81B 2203/033; B81B 2201/0257; B81B 3/0072; B81B 2203/03
USPC ................................. 257/415–420
See application file for complete search history.

(56) References Cited

U.S. PATENT DOCUMENTS

| 3,839,660 | A | 10/1974 | Stryker | 357/67 |
| 4,492,825 | A | 1/1985 | Brzezinski et al. | 179/111 |
| 4,524,247 | A | 6/1985 | Lindenberger et al. | 179/111 |
| 4,533,795 | A | 8/1985 | Baumhauer, Jr. et al. | 179/111 |
| 4,558,184 | A | 12/1985 | Busch-Vishniac et al. | 179/111 |
| 4,710,744 | A | 12/1987 | Wamstad | 338/4 |
| 4,740,410 | A | 4/1988 | Muller et al. | 428/133 |
| 4,744,863 | A | 5/1988 | Guckel et al. | 156/653 |
| 4,776,019 | A | 10/1988 | Miyatake | 381/174 |
| 4,800,758 | A | 1/1989 | Knecht et al. | 73/727 |

(Continued)

FOREIGN PATENT DOCUMENTS

| EP | 0 788 157 A2 | 8/1997 | H01L 23/495 |
| JP | 60-077434 A | 5/1985 | H01L 21/58 |

(Continued)

OTHER PUBLICATIONS

Unknown, *Microphone industry to expand MEMS-based offerings*, The Information Network, online <www.theinformationnet.com>, printed Feb. 1, 2005, Nov. 14, 2003, 2 pages.

(Continued)

*Primary Examiner* — Cuong Q Nguyen
*Assistant Examiner* — Nishath Yasmeen
(74) *Attorney, Agent, or Firm* — Sunstein Kann Murphy & Timbers LLP

(57) ABSTRACT

An encapsulated MEMS device includes stress-relief trenches in a region of its substrate that surrounds the movable micromachined structures and that is covered by a cap, such that the trenches are fluidly exposed to a cavity between the substrate and the cap. A method of fabricating a MEMS device includes fabricating stress-relief trenches through a substrate and fabricating movable micromachined structures, and capping the device prior art encapsulating the device.

21 Claims, 10 Drawing Sheets

(56) References Cited

U.S. PATENT DOCUMENTS

| | | | |
|---|---|---|---|
| 4,825,335 A | 4/1989 | Wilner | 361/283 |
| 4,853,669 A | 8/1989 | Guckel et al. | 338/4 |
| 4,872,047 A | 10/1989 | Fister et al. | 357/67 |
| 4,918,032 A | 4/1990 | Jain et al. | 437/228 |
| 4,948,757 A | 8/1990 | Jain et al. | 437/240 |
| 4,996,082 A | 2/1991 | Guckel et al. | 427/99 |
| 5,067,007 A | 11/1991 | Otsuka et al. | 357/74 |
| 5,090,254 A | 2/1992 | Guckel et al. | 73/862.59 |
| 5,105,258 A | 4/1992 | Silvis et al. | 257/748 |
| 5,113,466 A | 5/1992 | Acarlar et al. | 385/88 |
| 5,146,435 A | 9/1992 | Bernstein | 367/181 |
| 5,172,213 A | 12/1992 | Zimmerman | 257/796 |
| 5,178,015 A | 1/1993 | Loeppert et al. | 73/718 |
| 5,188,983 A | 2/1993 | Guckel et al. | 437/209 |
| 5,207,102 A | 5/1993 | Takahashi et al. | 73/727 |
| 5,241,133 A | 8/1993 | Mullen, III et al. | 174/52.4 |
| 5,273,939 A | 12/1993 | Becker et al. | 437/209 |
| 5,303,210 A | 4/1994 | Bernstein | 367/181 |
| 5,314,572 A | 5/1994 | Core et al. | 156/643 |
| 5,315,155 A | 5/1994 | O'Donnelly et al. | 257/711 |
| 5,317,107 A | 5/1994 | Osorio | 174/52.4 |
| 5,336,928 A | 8/1994 | Neugebauer | 257/758 |
| 5,452,268 A | 9/1995 | Bernstein | 367/181 |
| 5,468,999 A | 11/1995 | Lin et al. | 257/784 |
| 5,490,220 A | 2/1996 | Loeppert | 381/168 |
| 5,515,732 A | 5/1996 | Willcox et al. | 73/724 |
| 5,593,926 A | 1/1997 | Fujihira | 437/209 |
| 5,596,222 A | 1/1997 | Bernstein | 257/620 |
| 5,608,265 A | 3/1997 | Kitano et al. | 257/738 |
| 5,629,566 A | 5/1997 | Doi et al. | 257/789 |
| 5,633,552 A | 5/1997 | Lee et al. | 310/311 |
| 5,658,710 A | 8/1997 | Neukermans | 430/320 |
| 5,684,324 A | 11/1997 | Bernstein | 257/415 |
| 5,692,060 A | 11/1997 | Wickstrom | 381/169 |
| 5,740,261 A | 4/1998 | Loeppert et al. | 381/168 |
| 5,828,127 A | 10/1998 | Yamagata et al. | 257/706 |
| 5,870,482 A | 2/1999 | Loeppert et al. | 381/174 |
| 5,901,046 A | 5/1999 | Ohta et al. | 361/760 |
| 5,923,995 A | 7/1999 | Kao et al. | 438/460 |
| 5,939,633 A | 8/1999 | Judy | 73/514.32 |
| 5,945,605 A | 8/1999 | Julian et al. | 73/727 |
| 5,956,292 A | 9/1999 | Bernstein | 367/140 |
| 5,960,093 A | 9/1999 | Miller | 381/324 |
| 5,994,161 A | 11/1999 | Bitko et al. | 438/53 |
| 6,084,292 A | 7/2000 | Shinohara | 257/676 |
| 6,128,961 A | 10/2000 | Haronian | 73/774 |
| 6,169,328 B1 | 1/2001 | Mitchell et al. | 257/778 |
| 6,243,474 B1 | 6/2001 | Tai et al. | 381/174 |
| 6,249,075 B1 | 6/2001 | Bishop et al. | 310/338 |
| 6,309,915 B1 | 10/2001 | Distefano | 438/127 |
| 6,329,706 B1 | 12/2001 | Nam | 257/666 |
| 6,384,472 B1 | 5/2002 | Huang | 257/680 |
| 6,384,473 B1 | 5/2002 | Peterson et al. | 257/680 |
| 6,401,545 B1 | 6/2002 | Monk et al. | 73/756 |
| 6,433,401 B1 | 8/2002 | Clark et al. | 257/524 |
| 6,505,511 B1 | 1/2003 | Geen et al. | 73/504.12 |
| 6,522,762 B1 | 2/2003 | Mullenborn et al. | 381/174 |
| 6,535,460 B2 | 3/2003 | Loeppert et al. | 367/181 |
| 6,548,895 B1 | 4/2003 | Benavides et al. | 257/712 |
| 6,552,469 B1 | 4/2003 | Pederson et al. | 310/309 |
| 6,617,683 B2 | 9/2003 | Lebonheur et al. | 257/707 |
| 6,667,189 B1 | 12/2003 | Wang et al. | 438/53 |
| 6,667,557 B2 | 12/2003 | Alcoe et al. | 257/778 |
| 6,677,176 B2 | 1/2004 | Wong et al. | 438/612 |
| 6,704,427 B2 | 3/2004 | Kearey | 381/355 |
| 6,711,317 B2 | 3/2004 | Jin et al. | 385/18 |
| 6,732,588 B1 | 5/2004 | Mullenborn et al. | 73/715 |
| 6,741,709 B2 | 5/2004 | Kay et al. | 381/175 |
| 6,753,583 B2 | 6/2004 | Stoffel et al. | 257/416 |
| 6,768,196 B2 | 7/2004 | Harney et al. | 257/729 |
| 6,781,231 B2 | 8/2004 | Minervini | 257/704 |
| 6,812,620 B2 | 11/2004 | Scheeper et al. | 310/324 |
| 6,816,301 B1 | 11/2004 | Schiller | 359/290 |
| 6,821,819 B1 | 11/2004 | Benavides et al. | 438/122 |
| 6,829,131 B1 | 12/2004 | Loeb et al. | 361/234 |
| 6,847,090 B2 | 1/2005 | Loeppert | 257/418 |
| 6,857,312 B2 | 2/2005 | Choe et al. | 73/170.13 |
| 6,859,542 B2 | 2/2005 | Johannsen et al. | 381/174 |
| 6,914,992 B1 | 7/2005 | van Halteren et al. | 381/113 |
| 6,955,988 B2 | 10/2005 | Nevin et al. | 438/700 |
| 6,984,886 B2 | 1/2006 | Ahn et al. | 257/698 |
| 7,066,004 B1 | 6/2006 | Kohler | 73/1.38 |
| 7,166,911 B2 | 1/2007 | Karpman et al. | 257/711 |
| 7,268,463 B2 | 9/2007 | Li et al. | 310/209 |
| 7,551,048 B2 | 6/2009 | Iwata et al. | 335/78 |
| 7,839,052 B2 | 11/2010 | Wu et al. | 310/321 |
| 7,871,865 B2 | 1/2011 | Sengupta et al. | 438/126 |
| 8,103,027 B2 | 1/2012 | Zhang et al. | 381/175 |
| 8,344,487 B2 | 1/2013 | Zhang et al. | 257/669 |
| 8,698,292 B2 | 4/2014 | Najafi et al. | 257/678 |
| 8,906,730 B2 | 12/2014 | Graham et al. | 438/53 |
| 9,422,156 B2 | 8/2016 | Smeys | B81C 1/100238 |
| 2001/0055836 A1 | 12/2001 | Kunda | 438/108 |
| 2002/0102004 A1 | 8/2002 | Minervini | 381/175 |
| 2002/0125559 A1 | 9/2002 | Mclellan | 257/690 |
| 2003/0016839 A1 | 1/2003 | Loeppert et al. | 381/174 |
| 2003/0133588 A1 | 7/2003 | Pedersen | 381/423 |
| 2003/0189222 A1 | 10/2003 | Itou et al. | 257/200 |
| 2004/0041254 A1 | 3/2004 | Long et al. | 257/703 |
| 2004/0056337 A1 | 3/2004 | Hasebe et al. | 257/667 |
| 2004/0179705 A1 | 9/2004 | Wang et al. | 381/175 |
| 2004/0184632 A1 | 9/2004 | Minervini | 381/355 |
| 2004/0184633 A1 | 9/2004 | Kay et al. | 381/355 |
| 2004/0262781 A1 | 12/2004 | Germain et al. | 257/787 |
| 2005/0005421 A1 | 1/2005 | Wang et al. | 29/594 |
| 2005/0018864 A1 | 1/2005 | Minervini | 381/175 |
| 2005/0089188 A1 | 4/2005 | Feng | 381/396 |
| 2005/0093117 A1 | 5/2005 | Masuda et al. | 257/676 |
| 2005/0178208 A1* | 8/2005 | Benzel et al. | 73/715 |
| 2006/0246630 A1 | 11/2006 | Sunohara et al. | 438/125 |
| 2007/0040231 A1 | 2/2007 | Harney et al. | 257/415 |
| 2007/0042521 A1 | 2/2007 | Yama | 438/48 |
| 2011/0127623 A1* | 6/2011 | Fueldner et al. | 257/416 |
| 2011/0165717 A1* | 7/2011 | Lee et al. | 438/50 |
| 2012/0049298 A1* | 3/2012 | Schlarmann | B81C 1/00309 257/415 |
| 2012/0264250 A1 | 10/2012 | Graham et al. | 438/53 |
| 2014/0353772 A1 | 12/2014 | Stermer, Jr. et al. | 257/415 |
| 2016/0090297 A1 | 3/2016 | Zhang et al. | B81B 7/0019 |
| 2016/0229688 A1 | 8/2016 | Gu et al. | B81B 7/0048 |

FOREIGN PATENT DOCUMENTS

| | | | | |
|---|---|---|---|---|
| JP | 62-241355 A | 10/1987 | | H01L 23/04 |
| JP | 05-226501 A | 9/1993 | | H01L 23/12 |
| JP | 07-142518 A | 6/1995 | | H01L 21/52 |
| JP | 08-116007 A | 5/1996 | | H01L 23/48 |
| WO | WO 83/01362 | 4/1983 | | H04R 1/06 |
| WO | WO 91/05368 A | 4/1991 | | H01L 23/13 |
| WO | WO 01/20948 | 3/2001 | | H04R 1/00 |
| WO | WO 02/45463 | 6/2002 | | H04R 19/00 |
| WO | WO 2004/022477 | 3/2004 | | B81B 7/00 |
| WO | WO 2005/036698 | 4/2005 | | |
| WO | WO 2007/030345 A2 | 3/2007 | | H01L 23/495 |
| WO | WO/2012/037537 | * | 3/2012 | |
| WO | WO 2016/112463 A1 | 7/2016 | | B81B 7/02 |

OTHER PUBLICATIONS

Unknown, *Phone-Or's silicon membrane using MEMS technology*, online <file://C:\Documents%20and%20Settings\bmansfield\Local%20Settings\Temporary%20-Internet%20Files\OLKE\Phone-Or%20%...>, printed Feb. 1, 2005, 2 pages.

Unknown, *Liquid Crystal Polymer (LCP) Air Cavity Packages*, Quantum Leap Packaging, Inc., Brochure, 2004, 2 pages.

Bajdechi et al., *Single-Chip Low-Voltage Analog-to-Digital Interface for Encapsulation with Electret Microphone*, The 11th International Conference on Solid-State Sensors and Actuators, Jun. 10-14, 2001, 4 pages.

(56) References Cited

OTHER PUBLICATIONS

Bernstein, *MEMS Microphones at Draper*, MEMS Air Acoustics Research the Charles Stark Draper Laboratory, PowerPoint Presentation, Aug. 1999, 8 pages.
Bernstein et al., *High Sensitivity MEMS Ultrasound Arrays by Lateral Ferroelectric Polarization*, Solid-State Sensor and Actuator Workshop, Jun. 4-8, 2000, 4 pages.
Blackwell, *The Electronic Packaging Handbook*, CRC Press LLC, pp. 2-3, 7-1, 7-12, A-9, and A-11, 2000.
Brown, William D. (Ed.), *Advanced Electronic Packaging with Emphasis on Multi chip Modules*, Institute of Electrical and Electronics Engineers, Inc., pp. 4-8, 568, 1999.
Chen et al., *Single-Chip Condenser Miniature Microphone with a High Sensitive Circular Corrugated Diaphragm*, IEEE, 2002, 4 pages.
Cunningham et al., *Wide bandwidth silicon nitride membrane microphones*, SPIE vol. 3223, Sep. 1997, 9 pages.
Department of Defense, Test Method Standard Microcircuits, FSC 5962, completed 1997.
Fan et al., *Development of Artificial Lateral-Line Flow Sensors*, Solid-State Sensor, Actuator and Microsystems Workshop, Jun. 2-6, 2002, 4 pages.
Fuldner et al., *Silicon Microphones with Low Stress Membranes*, The 11$^{th}$ International Conference on Solid-State Sensors and Actuators, Jun. 10-14, 2001, 4 pages.
Gale et al., *MEMS Packaging*, University of Utah, Microsystems Principles, PowerPoint Presentation, Oct. 11, 2001, 8 pages.
Hall et al., *Self-Calibrating Micromachined Microphones with Integrated Optical Displacement Detection*, The 11th International Conference on Solid State Sensors and Actuators, Jun. 10-14, 2001, 4 pages.
Harper (Editor-in-Chief), *Electronic Packaging and Interconnection Handbook*, Third Edition, McGraw-Hill, Chapter 7, Section 7.2.3.1, 2000, 7 pages.
Heuberger, *Mikromechanik*, Springer Verlang A.G., pp. 470-476, 1989 (With translation).
Hsieh et al., *A Micromachined Thin-film Teflon Electret Microphone*, Department of Electrical Engineering California Institute of Technology, 1997, 4 pages.
Judy, *"Microelectromechanical systems (MEMS): fabrication, design and applications"*, Electrical Engineering Department, Institute of Physics Publishing, Smart Materials and Structures, vol. 10, pp. 1115-1134 Nov. 26, 2001.
Kabir et al., *High Sensitivity Acoustic Transducers with Thin P+ Membranes and Gold Back-Plate*, Sensors and Actuators, vol. 78, Issue 2-3, Dec. 17, 1999, 17 pages.
Ko et al., *Piezoelectric Membrane Acoustic Devices*, IEEE, 2002, 4 pages.
Kopola et al., *MEMS Sensor Packaging Using LTCC Substrate Technology*, VTT Electronics, Proceedings of SPIE vol. 4592, 2001, pp. 148-158.

Ma et al., *Design and Fabrication of an Integrated Programmable Floating-Gate Microphone*, IEEE, 2002, 4 pages.
Mason, Jack, *Companies Compete to Be Heard on the Increasingly Noisy MEMS Phone Market*, Small Times: News about MEMS, Nanotechnology and Microsystems, Jul. 18, 2003, 4 pages.
Maxim Integrated Products, *Electret Condenser Microphone Cartridge Preamplifier*, Maxim Integrated Products, Jul. 2002, 9 pages.
Neumann, Jr. et al., *A Fully-Integrated CMOS-MEMS Audio Microphone*, The 12$^{th}$ International Conference on Solid State Sensors, Actuators and Microsystems Jun. 8-12, 2003, 4 pages.
Ono et al., *Design and Experiments of Bio-mimicry Sound Source Localization Sensor with Gimbal-Supported Circular Diaphragm*, The 12$^{th}$ International Conference on Solid State Sensors, Actuators and Microsystems, Jun. 8-12, 2003, 4 pages.
Pecht, Michael (Ed.), *Handbook of Electronic Package Design*, Marcel Dekker, Inc. pp. 173, 179, 196, 210, 736, 744, 821 and 832, 1991.
Pedersen et al., *A Polymer Condenser Microphone on Silicon with On-Chip CMOS Amplifier*, Solid State Sensors and Actuators, 1997, 3 pages.
Prismark Partners, *"The Prismark Wireless Technology Report—Mar. 2005"*, Prismark Partners LLC; www.prismark.com, pp. 1-44.
Rugg et al., *Thermal Package Enhancement Improves Hard Disk Drive Data Transfer Performance*, Pan Pacific Microelectronics Symposium, Proceedings of the Technical Program, Island of Maui, Hawaii, Feb. 5-7, 2002, pp. 451-456.
Schafer et al., *Micromachined Condenser Microphone for Hearing Aid Use*, Solid-State Sensor and Actuator Workshop, Jun. 8-11, 1998, 4 pages.
Sheplak et al., *A Wafer-Bonded, Silicon-Nitride Membrane Microphone with Dielectrically-Isolated, Single-Crystal Silicon Piezoresistors*, Solid-State Sensor and Actuator Workshop, Jun. 8-11, 1998, 4 pages.
Stahl, et al., *Thin Film Encapsulation of Acceleration Sensors Using Polysilicon Sacrificial Layer, Transducers '03, The 12$^{th}$ International Conference on Solid State Sensors, Actuators and Microsystems*, Jun. 8-12, 2003, 4 pages.
Tilmans et al., *"The indent reflow sealing (IRS) technique—a method for the fabrication of sealed cavities for MEMS devices"*, IEEE, Journal of Microelectro-mechanical Systems, vol. 9, Issue 2, pp. 206-217, Jul. 2000 (Abstract only—3 pages).
Tummala, Rao R. et al. (Eds.), *Microelectronics Packaging Handbook, Semiconductor Packaging Part II*, Second Edition, Chapman & Hall, pp. 11-12, 1997.
Weigold et al., *A MEMS Condenser Microphone for Consumer Applications*, in Proceedings IEEE, International Conference on MEMS 2006, Istanbul, Turkey, Jan. 2006, pp. 86-89.
Yovcheva et al., *Investigation on Surface Potential Decay in PP Corona Electrets*, BPU-5: Fifth General Conference of the Balkan Physical Union, Aug. 25-29, 2003, 4 pages.
Zou et al., *A Novel Integrated Silicon Capacitive Microphone—Floating Electrode "Electret" Microphone (FEEM)*, Journal of Microelectromechanical Systems, vol. 7, No. 2, Jun. 1998, 11 pages.

\* cited by examiner

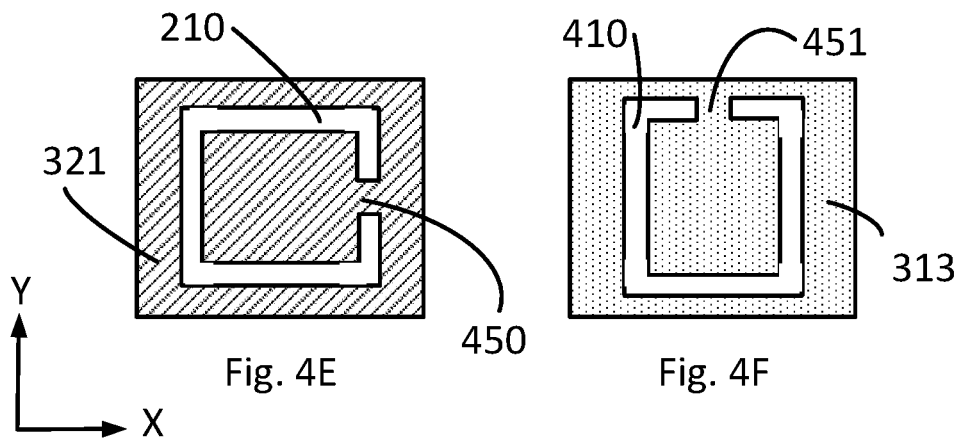
Fig. 4E
Fig. 4F
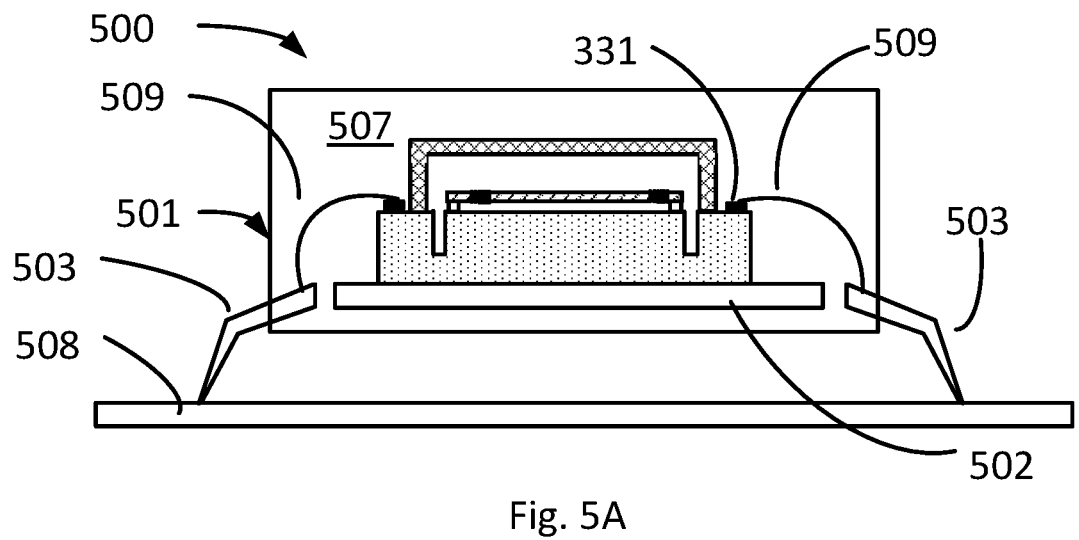
Fig. 5A
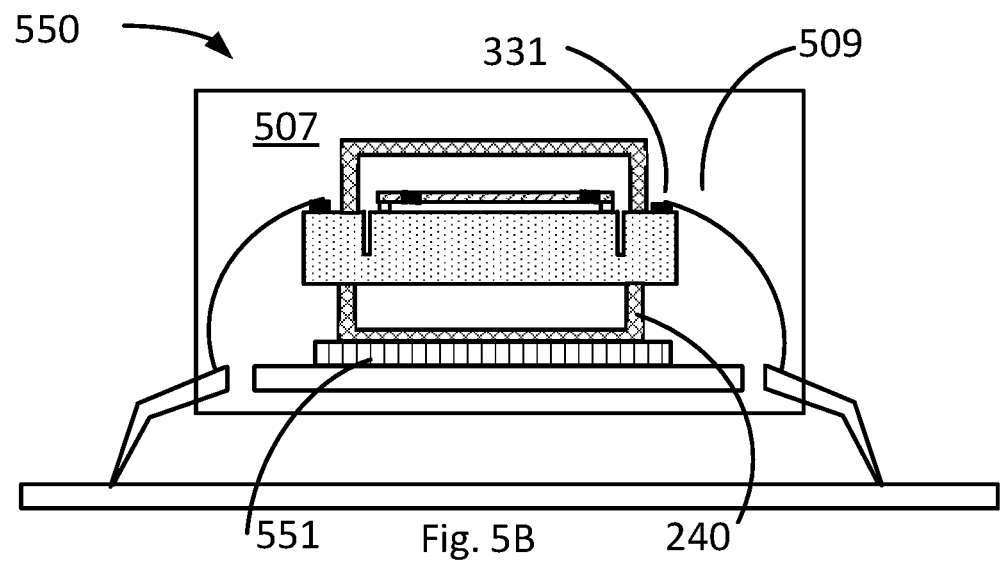
Fig. 5B

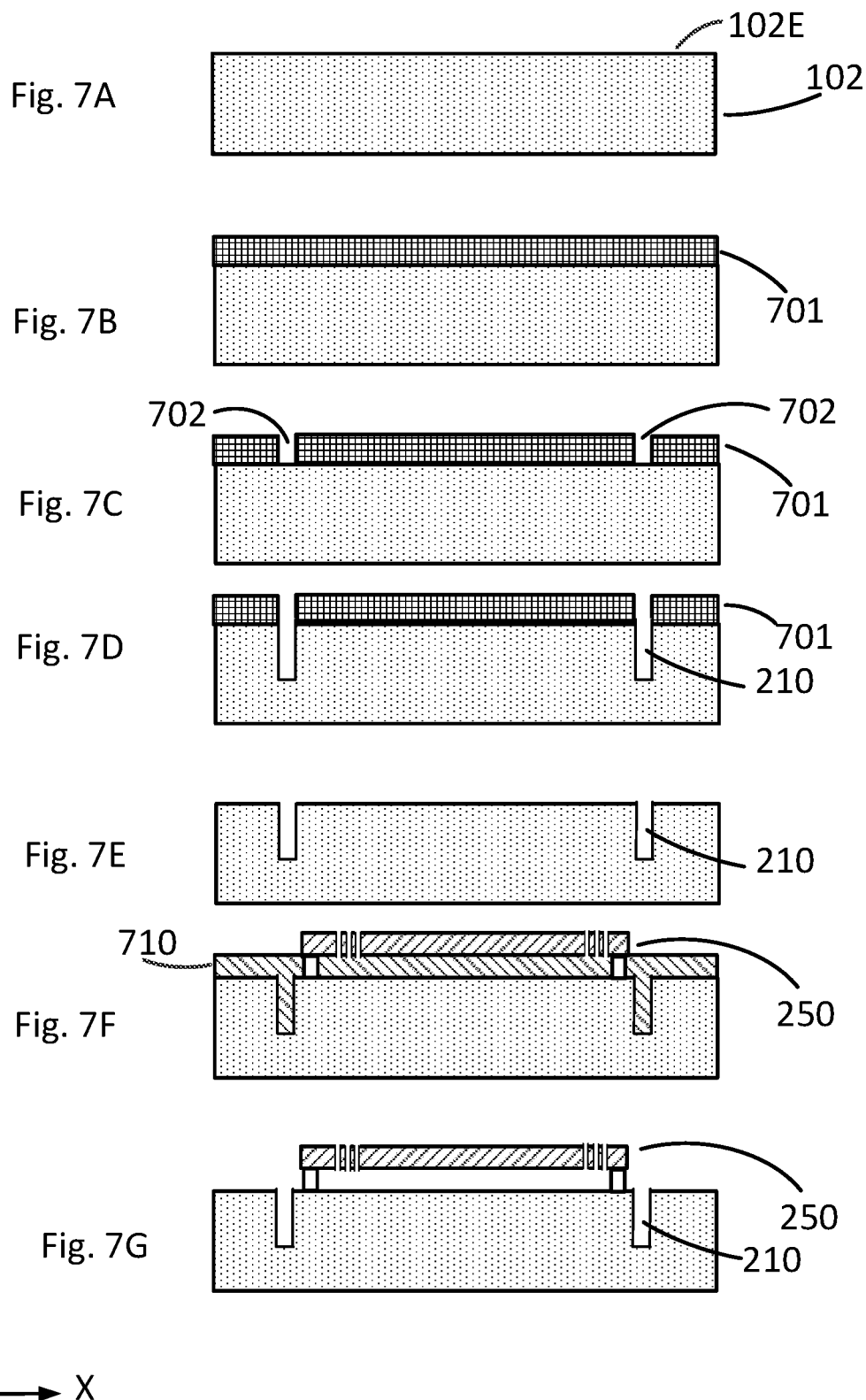

MEMS DEVICE WITH STRESS RELIEF STRUCTURES

TECHNICAL FIELD

The present invention relates to micromachined devices, and more particularly to structures of micromachined devices.

BACKGROUND ART

It is known in the prior art to package a micromachined (or "MEMS") device in a cavity package. Cavity packages are attractive for MEMS devices because they include an internal void or "cavity" that encloses the MEMS device without physically contacting or restraining a movable portion of the MEMS device. The cavity area mainly protects the MEMS device from external stresses originating from thermal, torque and pressure loads. Although cavity packages are significantly reliable, they suffer from high cost.

Overmold packaging, while common for packaging non-micromachined integrated circuits, has presented challenges to MEMS packaging. The process of encapsulating a MEMS device may involve physical and thermal shock to the MEMS device. In addition, the overmold material properties widely change with temperature. In the case of a silicon-based MEMS device encapsulated in plastic overmold, this includes both the plastic's stiffness and thermal expansion coefficient, which are largely different from the corresponding properties of silicon. As a result, thermal stresses in the package due to the wide operational temperature, which may range for example from 175 C to −40 C, create large stresses in the MEMS sensor, may cause performance problems, such as large sensitivity drift of these sensors over the temperature.

SUMMARY OF THE EMBODIMENTS

In a first embodiment of the invention there is provided a MEMS device including a substrate having a top surface and a peripheral region; a beam support structure coupled to the substrate, the beam support structure circumscribed by the peripheral region; a cap coupled to the top surface of the substrate and surrounding the peripheral region, the cap sealed to the top surface and creating a cap void between the cap and the top surface; and a released movable MEMS structure suspended from the beam support structure and exposed within the MEMS volume. The movable MEMS structure may be a proof mass of an accelerometer or gyroscope, or the diaphragm of a microphone, to name but a few examples.

The substrate of the MEMS device also includes at least one stress-relief trench within in the peripheral region. The stress-relief trench extends into the top surface and in fluid communication with the cap void. In some embodiments, the stress-relief trench has an aspect ratio of 10:1.

In some embodiments, the at least one stress-relief trench circumscribes the MEMS structure and the beam support structure by at least 270 degrees. For example, the stress-relief trench may be a continuous trench that circumscribes the MEMS structure and the beam support structure by at least 270 degrees. Alternately, the at least one stress relief trench may include a plurality of stress-relief trenches that, collectively, surround the MEMS structures by 360 degrees.

In some embodiments, the substrate is mounted to a base, such as a lead frame having a plurality of electrically independent leads, and/or ASIC for example, and the substrate and cap, and at least a portion of the base, encapsulated in an encapsulant. In some embodiments, the base may be a portion of a lead frame (such as a paddle, or the tips of leads, for example)

The MEMS device may also include a backside-cap coupled to a side of the substrate opposite the top surface. Indeed, the backside cap may be coupled to the substrate directly opposite the cap on the top side.

In some embodiments, the substrate is a silicon-on-insulator wafer having a device layer, a handle layer, and an insulator layer sandwiched between the device layer and the handle layer, and the beam support structure is coupled to the device layer. Further, in some embodiments the stress-relief trench is a contiguous trench that extends through the beam support structure, the device layer, the handle layer, and the insulator layer, such that a portion of the stress-relief trench through the beam support structure is in fluid communication with a portion of the stress-relief trench through the handle layer.

In another embodiment, a MEMS device includes a substrate having a device layer having a top surface and an opposing bottom surface, a handle layer, and an insulator layer. The device layer further includes the top surface and an opposing device interior surface, and a peripheral region, and the insulator layer is sandwiched between the handle layer and the device interior surface. The MEMS device also has a suspension structure in or above the device layer, and a released proof mass suspended from the suspension structure. A cap is coupled to the surface and surrounds the peripheral region, and is sealed to the top surface and creates a cap void between the cap and the top surface, such that the proof mass exposed within the cap void. The MEMS device also includes at least one stress-relief trench within in the peripheral region, the stress-relief trench extending into the top surface and extending through the device layer to the insulator layer. The stress-relief trench is in fluid communication with the cap void.

Some such MEMS devices also include a handle trench extending through the handle layer. Indeed, in some embodiments, the handle trench is radially offset from the stress-relief trench. In some embodiments, the handle trench is axially offset from the stress-relief trench. Further, some such MEMS devices include box trench the insulator layer, the box trench extending between the device layer and the handle layer. In some embodiments, the box trench is axially and/or radially offset from both the stress-relief trench and the handle trench.

A method of fabricating an encapsulated MEMS device includes providing a substrate having a top surface and a bottom surface opposite the top surface, the top surface having a peripheral region; fabricating a beam support structure coupled to the substrate, the beam support structure circumscribed by the peripheral region; fabricating a released movable MEMS structure suspended from the beam support structure; fabricating at least one stress-relief trench in the peripheral region, the stress-relief trench at least partially circumscribing the movable MEMS structure; attaching a cap to the top surface of the substrate, the cap defining a sealed MEMS volume between the cover and the top surface, such that the movable MEMS structure is exposed within the MEMS volume, and such that the at least one relief trench opens into the MEMS volume; coupling the substrate to a base member; placing the substrate and the base member into a molding chamber; and injecting encapsulant into the molding chamber, so as to completely encapsulate at least the substrate within the encapsulant.

The substrate may be an integrated circuit (such as an ASIC, for example), or the paddle or leads of a lead frame.

The method may also include adding a backside cap to the bottom surface directly opposite the cap, prior to injecting the encapsulant.

BRIEF DESCRIPTION OF THE DRAWINGS

The foregoing features of embodiments will be more readily understood by reference to the following detailed description, taken with reference to the accompanying drawings, in which:

FIGS. 4A-4F schematically illustrate a variety of stress-relief trenches in a silicon-on-insulator MEMS device;

FIGS. 5A-5B schematically illustrate encapsulated MEMS devices;

FIGS. 7A-7G schematically illustrate a MEMS device with stress-relief trenches at various stages of fabrication.

DETAILED DESCRIPTION OF SPECIFIC EMBODIMENTS

Various embodiments offers solutions to minimize the effect of package stresses into the MEMS sensors packaged in overmold (e.g., plastic) packages. Any of a variety of stress-relief structures may be included in a wafer or silicon-on-insulator substrates to block or divert compressive or tensile stresses within the substrate, with the result that distortion of MEMS structures is reduced and the accuracy of the MEMS structures is increased in comparison to prior art MEMS device. A variety of such MEMS device, and methods for fabricating such MEMS devices, are detailed below.

Figure 1A:
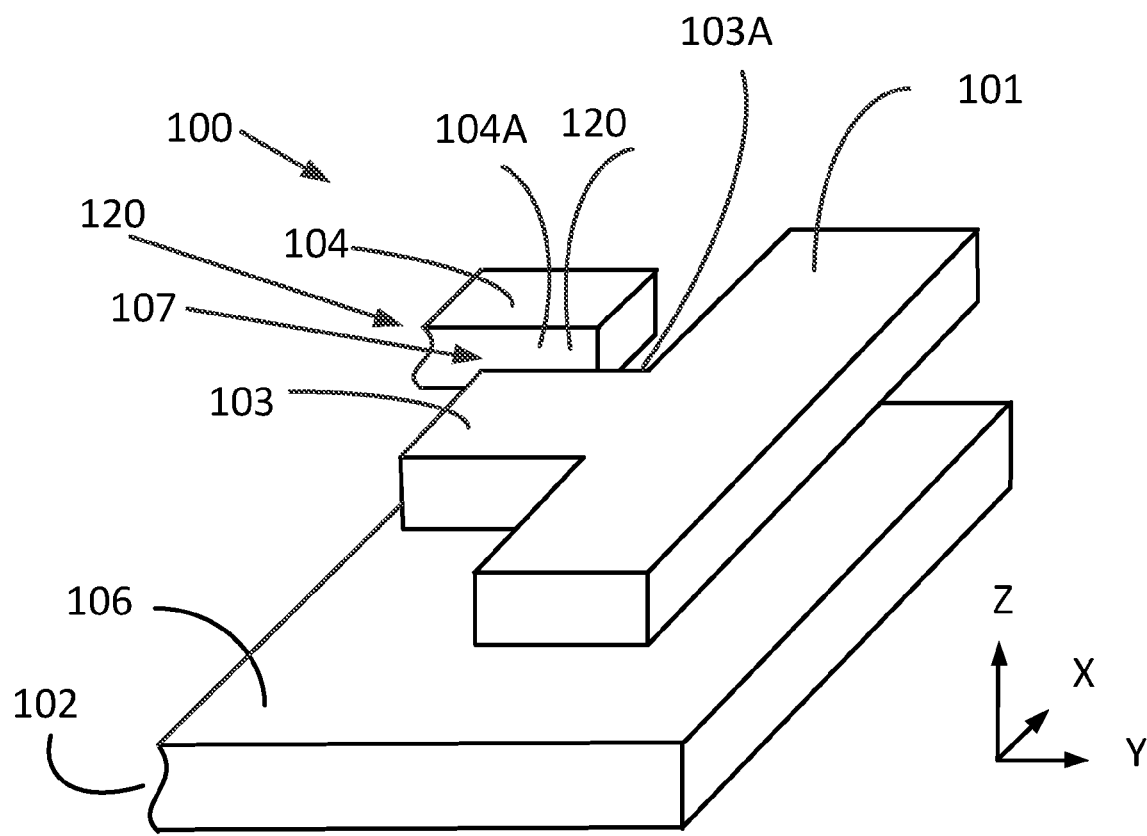
FIGS. 1A and 1B schematically illustrate a MEMS accelerometer.
Figure 1B:
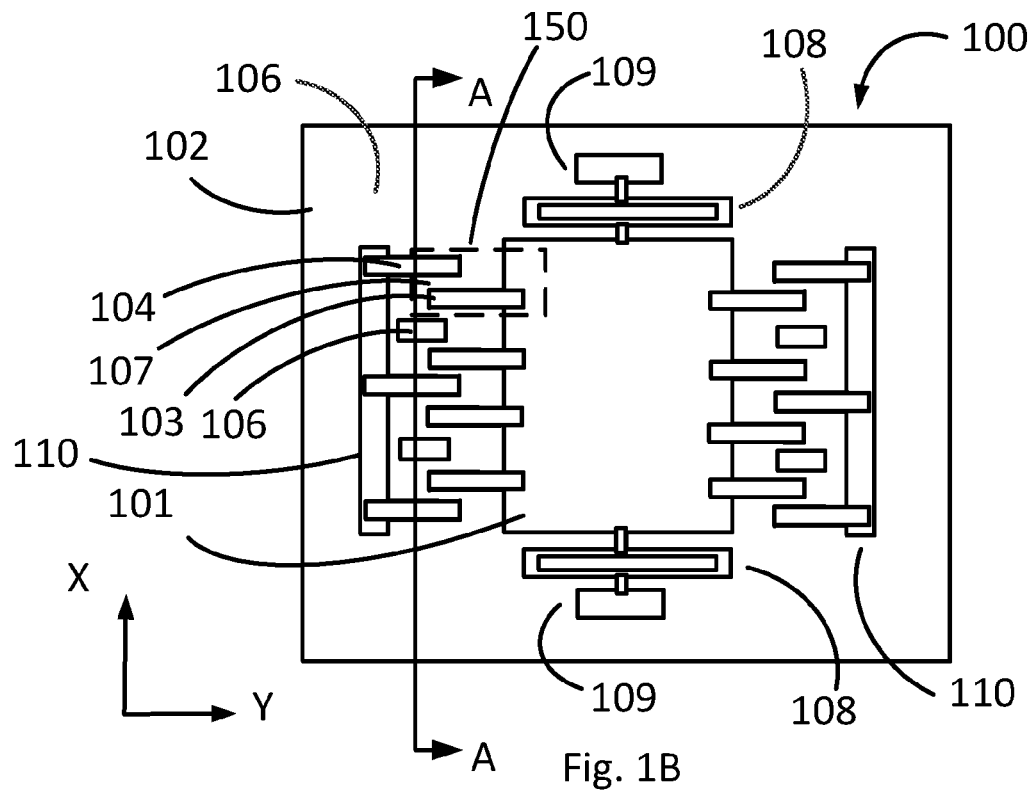

Some MEMS devices include structures suspended above a substrate. For example, FIGS. 1A and 1B schematically illustrate a portion of a micromachined accelerometer 100, in which a proof mass (or "beam") 101 is suspended by springs 108 and anchors 109 above a substrate 102. The springs 108 and anchors 109 may be known as "beam support structures." FIG. 1B schematically illustrates a plan view of the accelerometer 100, while FIG. 1A schematically illustrates a perspective view of a partial cross section of a portion accelerometer 100 in area 150 along line A-A.

When the accelerometer 100 is not subject to an acceleration, the beam 101 remains suspended above the substrate 102 in a position that may be known as its "nominal" position, and does not move relative to the substrate 102. However, when the substrate 102 is subjected to acceleration, for example in the +X direction, the inertia of the beam 101 causes a displacement of the beam 101 relative to the substrate 102.

A finger 103, on the beam 101 forms a variable capacitor 161 across gap 107 with a counterpart finger 104, and a separate variable capacitor with fixed finger 105. Finger 105 is coupled to the substrate 102, and finger 104 is suspended from finger anchor 110, which is coupled to the substrate 102. The capacitance of each variable capacitor varies when the beam 101 moves relative to the substrate 102. The variable capacitance can be electronically processed to produce an electrical signal representing the displacement of the beam 101, which in the case of accelerometer 100 correlates to the applied acceleration.

The gap 107 is typically quite small. For example, in the accelerometer 100, the gap 107 may be on the order of a few microns. As such, any distortion in the proof mass 101 or substrate 102, for example due to thermal stress within substrate 102, may also cause a change in the gap 107. Such a change may appear as a DC offset in the displacement signal.

Figure 2A:
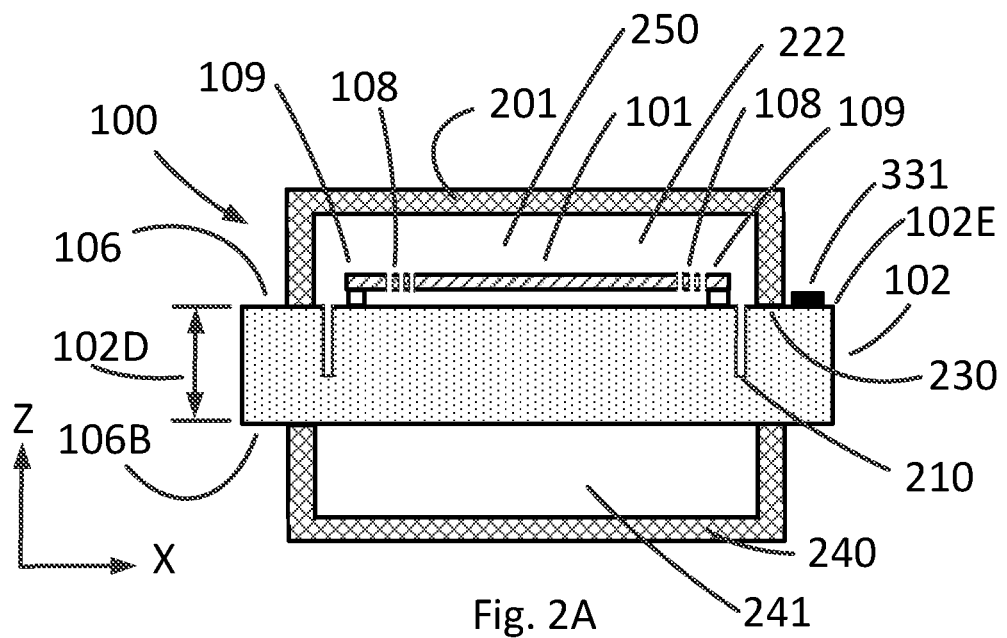
FIGS. 2A-2F schematically illustrate various features of embodiments of MEMS devices with at least one stress-relief trench.
Figure 2B:
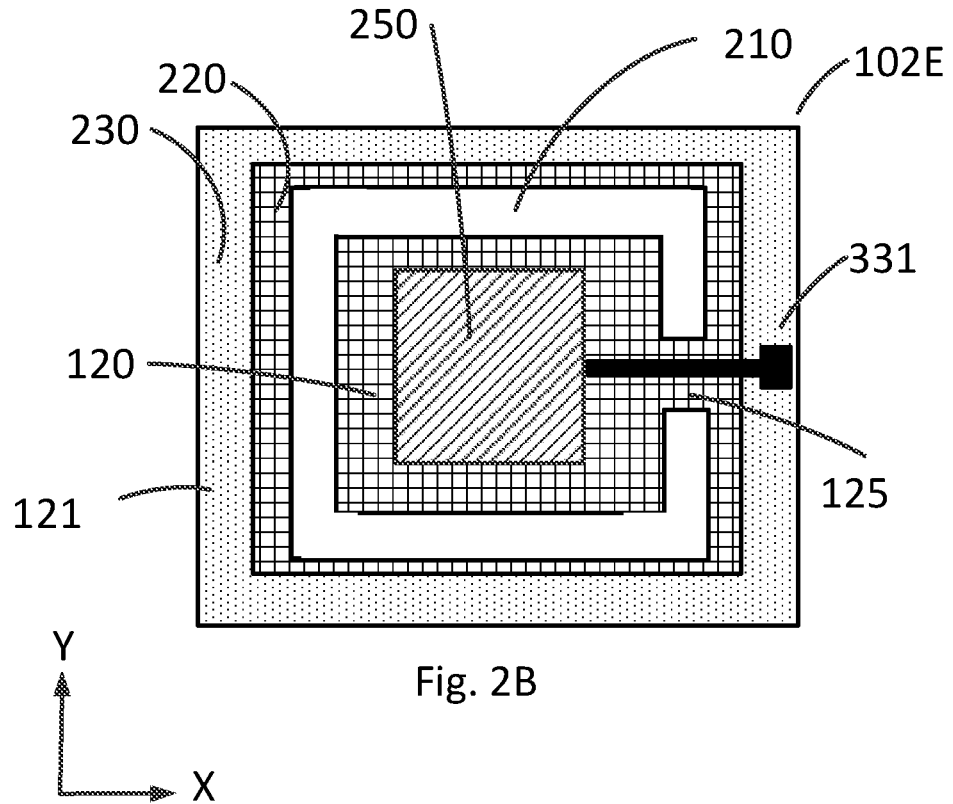

To mitigate such distortions, accelerometer 100 includes a stress-relief trench, which serves to intercept, block or divert stresses within the substrate 102. One embodiment of a stress-relief trench 210 is schematically illustrated in FIG. 2A and FIG. 2B, for example. The illustrative MEMS structure 250 may be any of a variety of MEMS structures, including an inertial proof mass (e.g., 101) for an accelerometer or gyroscope, a diaphragm (e.g., 303) for a microphone, or a cantilevered beam for a switch, to name but a few. For purposes of illustration, the MEMS structure 250 includes a beam 101 suspended from anchors 109 by springs 108.

Wafer Embodiment

Figure 2C:
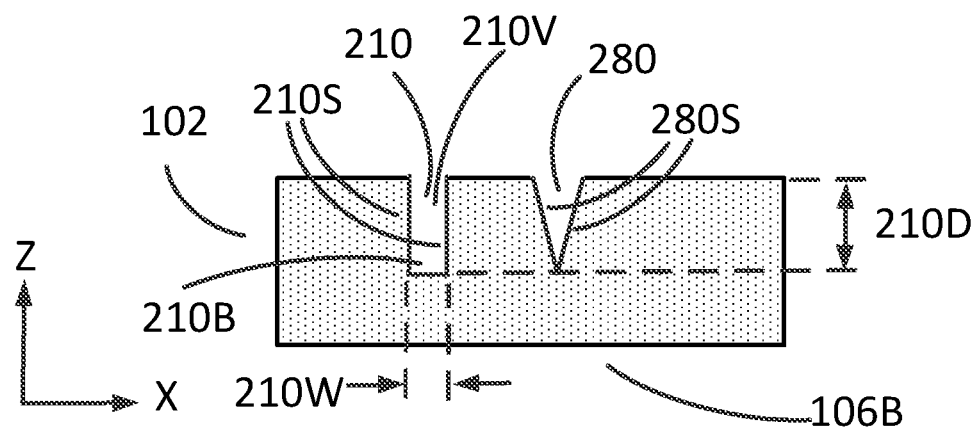

In the embodiment of FIG. 2A and FIG. 2B, the trench 210 extends from the surface 106 into the substrate 102. In some embodiments, the aspect ratio of trench 210 (i.e., ratio depth 210D to width 210W) may be 10:1 or greater. As schematically illustrated in FIG. 2A and FIG. 2C, in a plane normal to the surface 106 of the substrate 102, the trench 210 has two opposing sidewalls 210S, and a bottom 210B, although other embodiments may have different trench profiles. For example, as schematically illustrated in FIG. 2C a trench 280 may have sloping sidewalls 680S that form a V-shaped profile.

In some embodiments, the trench 210 may extend halfway or more through the depth 102D of the substrate 102. As such, a compressive or tensile stress traveling through the substrate 102, and particularly near the surface 106 of the substrate 102 for example from the edge 102E of the substrate 102, may be prevented from reaching portions of the MEMS structure 250, such as anchors 109 for example. In some embodiments, such stress may also be blocked from traveling through the substrate 102 because, for example, the walls 210S of the trench 210 may expand into the void 210V of the trench, thereby relieving the stress. In some embodiments, such stress may be diverted towards the bottom 106B of the substrate 102. As such, stress-induced distortion of the capacitances 120 of the MEMS device 250 may be mitigated, reduced or prevented.

FIG. 2B schematically illustrates the radial configuration of the trench 210 in the substrate 102. In other words, the trench 210 is located radially outward from the MEMS structure 250.

The substrate 102 may be defined as having a "peripheral region" 220 around the MEMS structure. 250. For example, in the embodiment of FIG. 2B, the peripheral region 220 extends radially outwardly between the MEMS structure 250 and an edge 102E of the substrate 102, and the trench 210 is located within the peripheral region 220. As such, the trench 210 does not intersect any trench or cavity that may form part of a MEMS structure, and does not pass through or undermine any part of the MEMS structure 250. Indeed, even if the trench 210 were omitted from the device 100, the MEMS structures (e.g., beam 101) could still be released and movable with respect to the substrate 102. The walls 210S of the trench 210 do not form a capacitance with any movable MEMS structure (e.g., beam 101) or fixed electrode.

The illustrative trench 210 in FIG. 2B does not completely circumscribe the MEMS structure 250, but leaves a bridge structure 125 extending from the interior portion 120 of the substrate 102 in the region of the MEMS structure 250 into the peripheral region 121 of the substrate 102. As such, the trench 210 circumscribes more than 270 degrees of the MEMS structure 250. The bridge structure 125 provides physical support to keep the interior portion 120 of the substrate 102 coupled to the outer region 121 of the substrate, and also provides a structure by which contact 331 may be electrically coupled to the MEMS structure 250. Alternate embodiments may include more than one bridge structure, as schematically illustrated by bridges 125X and 125Y in FIG. 2F. Indeed, as schematically illustrated in FIG. 2F, the two bridges 125X, 125Y are symmetrically disposed (i.e., in this embodiment, no opposite sides of) around MEMS structure 250, although other embodiments may include non-symmetric arrangements of bridges 125. As shown in FIG. 2F, two trenches (210X; 210Y, which may represent any the trenches described herein) together circumscribe more than 270 degrees of the MEMS structure 250.

Some embodiments may also include a cap-bonding region 230, radially outward from the MEMS structure, and radially outward from the peripheral region 220. Alternately, the cap-bonding region 230 may be coincident with (e.g., overlap) the radially outward portion of the peripheral region 220, but is radially outward of the trench 210.

A cap 201 may be bonded to the substrate 102 in the cap-bonding region 230, so as to form a void 222 between the substrate 102 and cap 201. The stress-relief trench 210 is circumscribed by the cap-bonding region, so that the cap 201 does not cross or enter any portion of trench 210. In other words, the trench 210 opens at the surface 106 of the substrate 102 at a location within the void 222, and the trench 210 is in fluid communication with the void 222. Among other things, this assures that no encapsulant will enter the trench 210 if the device 100 is encapsulated, for example in a plastic encapsulant.

Some embodiments also include a back-cap (or backside-cap) 240 coupled to the side 106B of the substrate 102 opposite the side 106 of the MEMS structure 250. In embodiments, the back-cap is directly opposite the cap 201, and in some embodiments, the back-cap covers a portion of the backside 106B of the substrate 102 substantially the same size as the portion of the surface 106 covered by the cap 201. The back-cap 240 defines a backside void 241 between the back-cap 240 and the substrate 102. The backside void 241 serves as a stress buffer for stresses approaching the substrate 102 from the backside direction. Any of the embodiments described herein may include a back-cap 240, although such a back-cap 240 is only illustrated in some of the figures.

Figure 2D:
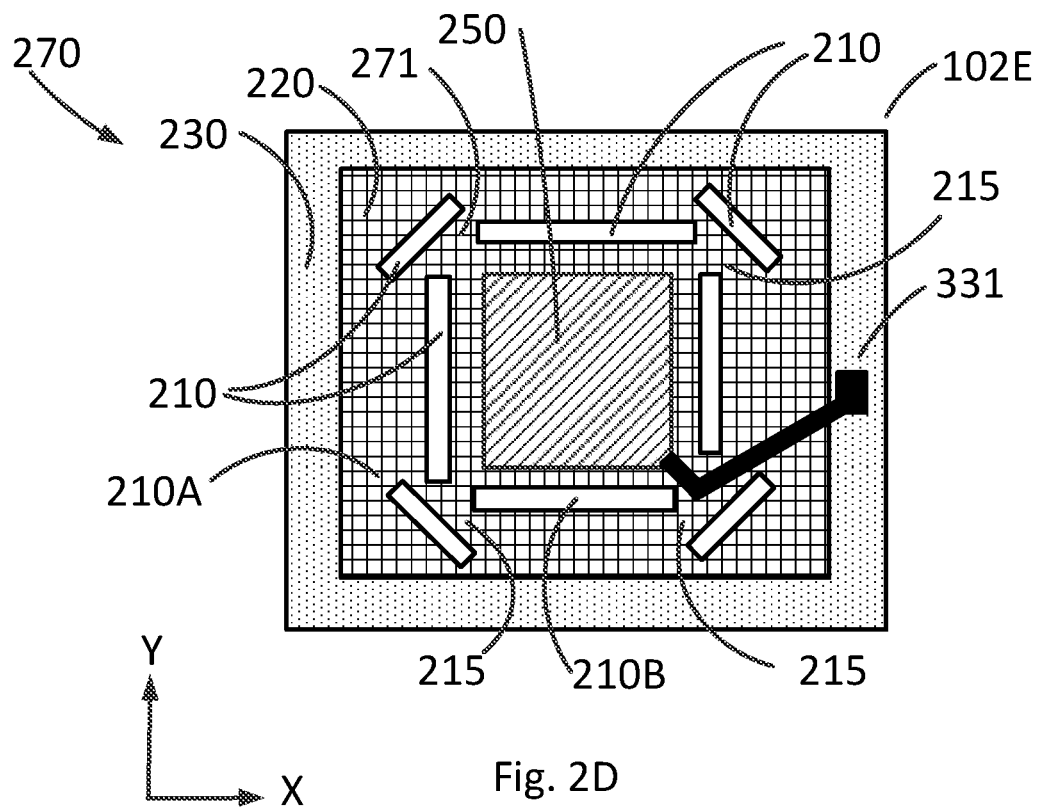

An alternate embodiment 270 is schematically illustrated in FIG. 2D, which includes several stress-relief trenches 210 within the peripheral region 220 and surrounding a MEMS structure 250.

In this embodiment, a number of individual trenches surround the MEMS structure 250 from all angles (i.e., 360 degrees), while still leaving a number of bridge regions 125 that provide physical support to the portion of the substrate 102 beneath the MEMS structure 250, and also allow a contact 331 to electrically couple the MEMS structure 250. In other words, no line extending radially from the MEMS structure 250 could reach the edge 201E of the substrate without passing through a trench 210. Similarly, no tensile or compressing stress in the substrate 102 could reach the MEMS structure 250 without being disrupted or blocked by a trench 210.

Figure 2E:
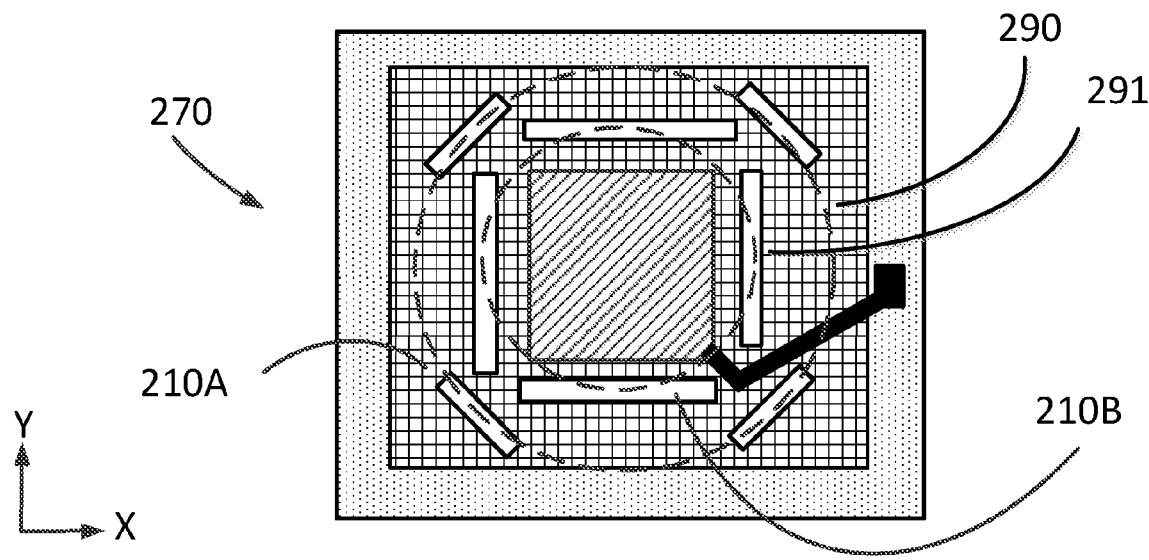
Figure 2F:
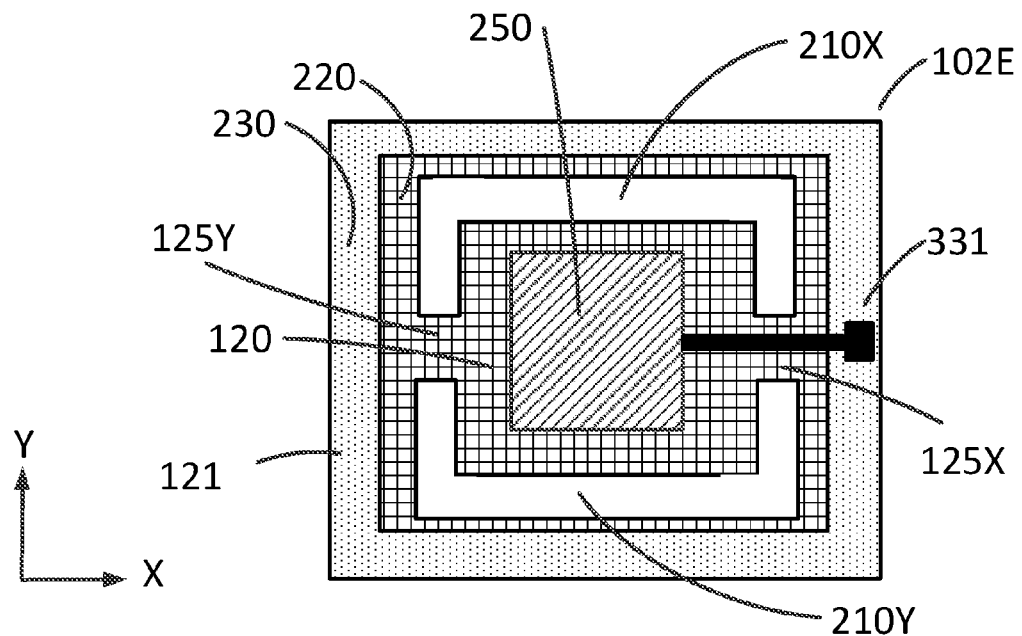

Some trenches 210 are closer to the MEMS structure 250 than other trenches 210. In other words, some outer trenches (e.g., 210A) are radially further from the MEMS structure 250 than some inner trenches (e.g., 210B). In some embodiments, a first set of trenches (e.g., 210A) may lie along, or be tangential to, an outer circle (290) having a first radius from the MEMS structure, while a second set of trenches (e.g., 210B) may lie along, or be tangential to, an inner circle (291) having a second radius from the MEMS structure, where the first radius is larger than the second radius, as additionally schematically illustrated in FIG. 2E.

SOI Embodiment

Figure 3A:
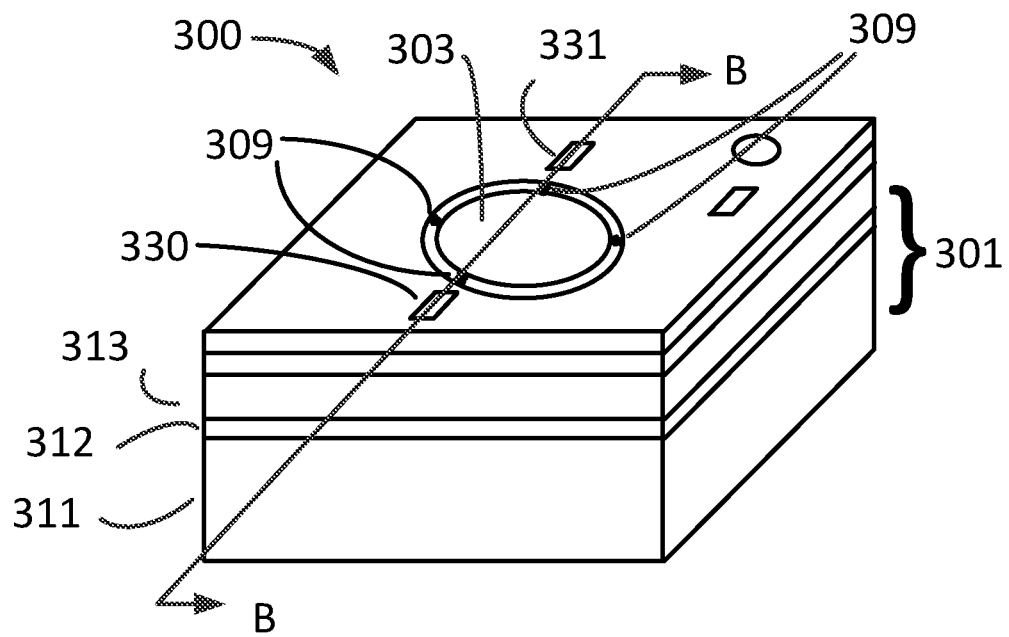
FIGS. 3A-3D schematically illustrate MEMS device fabricated from or on a silicon-on-insulator substrate.

Some MEMS devices are fabricated on or from a Silicon-on-Insulator (or "SOI") wafer, such as the SOI wafer 301 in FIG. 3A. A typical SOI wafer 301 has a base layer, sometimes known as a "handle layer" 311. The handle layer 311 may be silicon, for example. The SOI wafer 301 also has a top layer, sometimes known as a "device" layer 313, coupled to one side of the handle layer 311 by an insulator layer 312. The device layer 313 may be doped or un-doped silicon, for example, and may be thinner than the handle layer 311. The insulator layer 312 may be an oxide (e.g., a "buried" oxide, or "box"), and is sandwiched (e.g., laminated) between the handle layer 311 and the device layer 313.

Figure 3B:
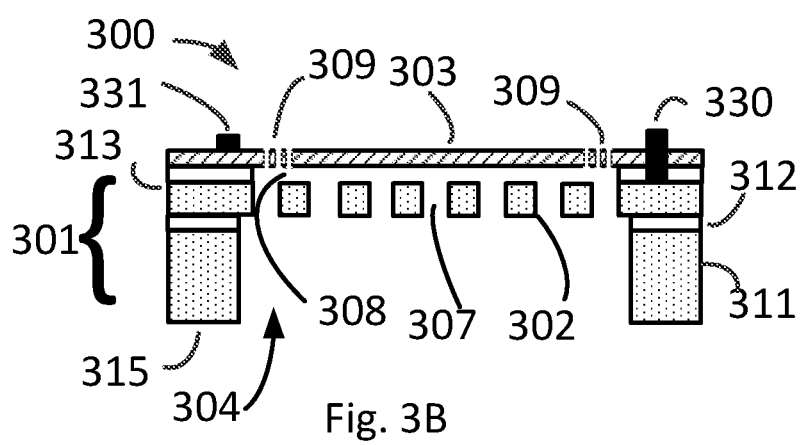

To further illustrate such devices, FIG. 3A schematically illustrates a top, perspective view of a MEMS microphone chip 300. FIG. 3B schematically shows a cross-sectional view of a MEMS microphone chip 300 along section B-B. Microphone chip 300 is discussed to detail some exemplary components of a MEMS microphone.

As shown in FIGS. 3A and 3B, the microphone chip 300 has the chip base/substrate—SOI wafer 301, one portion of which supports a backplate 302. The microphone 300 also includes a flexible diaphragm 303 that is movable relative to the backplate 302. The diaphragm 303 is suspended by springs 309, and the backplate 302 and diaphragm 303 are separated by a gap 308, and together form a variable capacitor across gap 308.

In some microphones, the backplate 302 is formed from single crystal silicon (e.g., a part of the device layer 313), while the diaphragm 303 is formed from deposited polysilicon. In other embodiments, however, the backplate 302 and diaphragm 303 may be formed from different materials.

In the embodiment shown in FIG. 3B, the microphone substrate 301 includes the backplate 302 and other structures, such as a bottom wafer 311 and a buried oxide layer (or "box layer") 312 of an SOI wafer. A portion of the substrate 301 also forms a backside cavity 304 extending from the bottom 315 of the substrate 301 to the bottom of the backplate 302. To facilitate operation, the backplate 302 has a plurality of through-holes 307 that lead from gap 308 (i.e., a gap between the diaphragm 303 and backplate 302) to the backside cavity 304. As such, the diaphragm 303 is exposed through the backside cavity 304. One or more terminals 330, 331 may electrically couple features of the microphone to circuitry on the MEMS device, or external circuitry. For example, in the embodiment of FIGS. 3A and 3B, the terminal 330 is electrically coupled to the backplate 302, and the terminal 331 is electrically coupled to the diaphragm 303.

It should be noted that various embodiments are sometimes described herein using words of orientation such as "top," "bottom," or "side." These and similar terms are merely employed for convenience and typically refer to the perspective of the drawings. For example, the substrate 301 is below the diaphragm 303 from the perspective of FIGS. 3A and 3B. However, the substrate 301 may be in some other orientation relative to the diaphragm 303 depending on the orientation of the MEMS microphone 300. Thus, in the present discussion, perspective is based on the orientation of the drawings of the MEMS microphone 300.

In operation, acoustic signals strike the diaphragm 303, causing it to vibrate, thus varying the gap 308 between the diaphragm 303 and the backplate 302 to produce a changing capacitance. The diaphragm may generally move in a plunger-like motion, in which the diaphragm 303 remains parallel to the backplate 302 as it moves towards, or recedes from, the backplate 302.

Figure 3C:
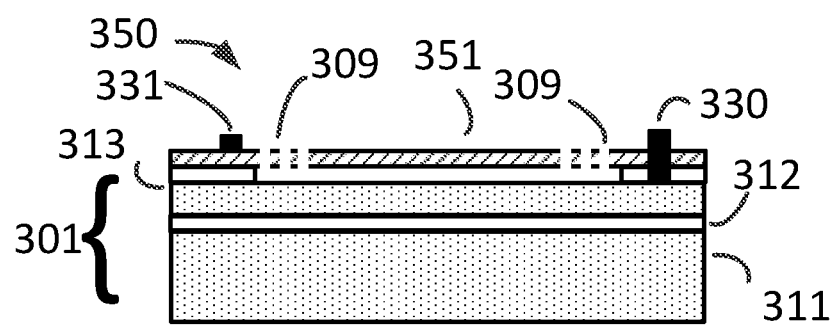
Figure 3D:
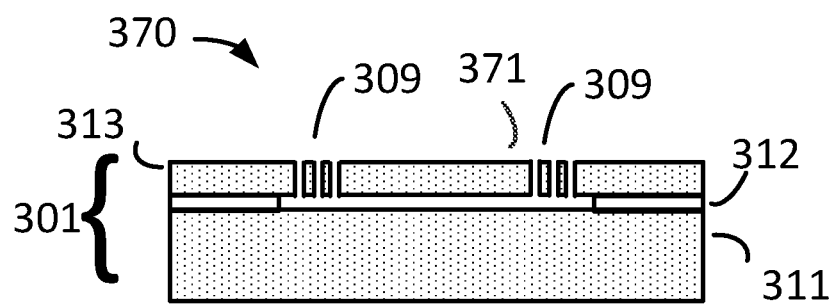

Although FIGS. 3A and 3B schematically illustrate a microphone 300, in which the suspended MEMS structures include the diaphragm 303 and the springs 309, other MEMS devices may have a movable mass other than a diaphragm. For example, in the device 350 schematically illustrated in FIG. 3C, the movable mass 351 may be the proof mass of an accelerometer or gyroscope, for example. As another example, the device 370 schematically illustrated in FIG. 3D includes a proof mass 371 in the device layer 313 of an SOI wafer 301. For purposes of illustration, however, the microphone 300 of FIGS. 3A and 3B and a method for fabricating such a microphone 300 are described in more detail below, with the understanding that the principles and structures also apply to other MEMS devices, such as accelerometers and gyroscopes for example.

Various embodiments of stress-relief trenches in an SOI-based MEMS device 400 are schematically illustrated in FIGS. 4A-4D.

Figure 4A:
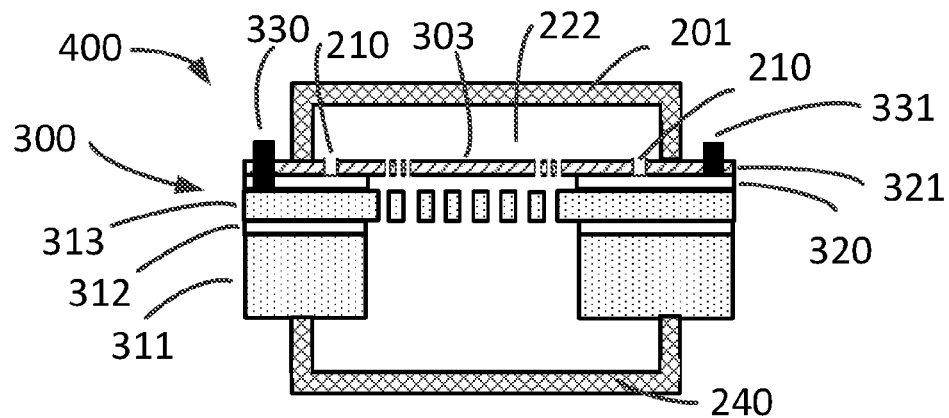

In FIG. 4A, the diaphragm 303 is in MEMS layer 321, which is supported from device layer 313 by insulator layer 320. In this embodiment, the device 400 includes a cap 201, which creates a void 222 above the SOI substrate 301 (i.e., layers 311, 312, and 313). One or more trenches 201 extend in to the MEMS layer 321, to the insulator layer 320.

Figures 4B, 4C:
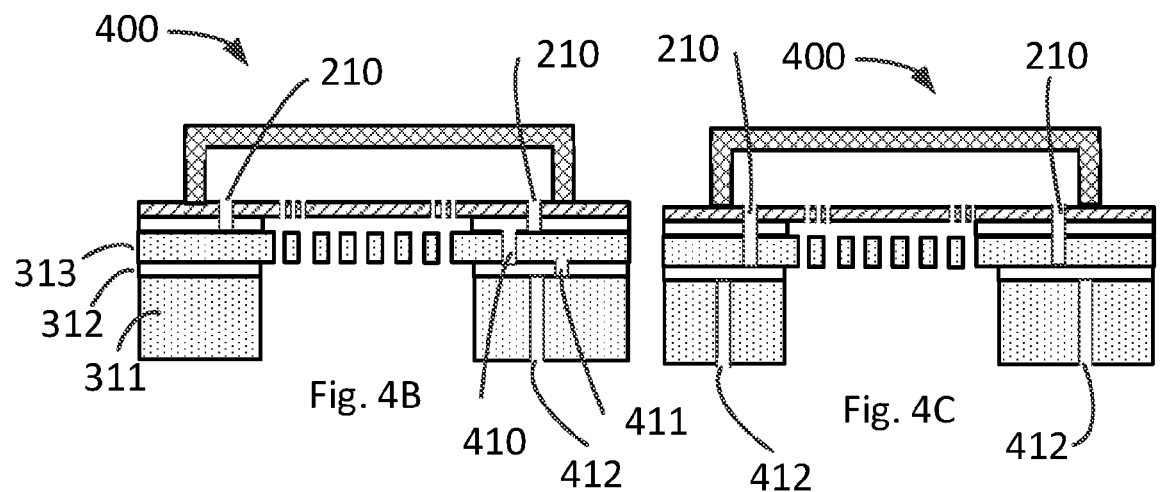

In another embodiment, the trench 210 extends through both the MEMS layer 321 and insulator layer 320, to the top of the device layer 313, as schematically illustrated in FIG. 4B. In some embodiments, another void, or enclosed trench 410 extends through the device layer 313, but is not aligned with the trench 210, as schematically illustrate in FIG. 4B. In some embodiments, another void 411 extends through box layer 312, but is not aligned with adjoining void 410, or with handle trench 412 in the handle layer 311.

In yet another embodiment of a trench 210 in FIG. 4C, the trench 210 extends through the MEMS layer 321, insulator layer 320 and device layer 313, to box layer 312. In some embodiments, also schematically illustrated in FIG. 4C, another trench 412 extends through the handle layer 311, but does not meet, or align with, the trench 310. Such trenches 310 and 412 may be referred-to as being radially offset from one another.

Figure 4D:
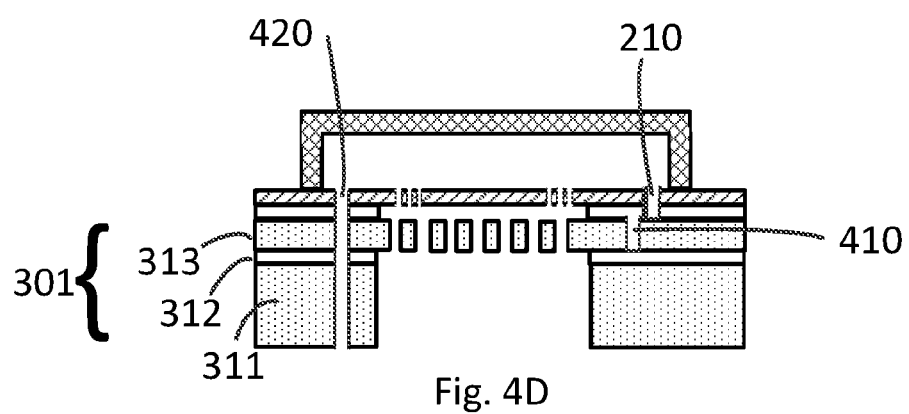

In an alternate embodiment, a trench 420 may extend all the way through the SOI wafer 301, and may also extend through the MEMS layer 321 and insulator layer 320, as schematically illustrate in FIG. 4D. In other words, trench 420 is a contiguous trench, such that the portion of the trench 420 that through the MEMS layer 321 is in fluid communication with the portion of the trench 420 that passes through the handle layer 311 and all portions of the trench 420 in between.

For embodiments with trenches or voids in different layers, the trenches or voids may be oriented such that they (or their bridges) do not align. For example, a trench 210 in a MEMS layer 321 may have the same shape as a trench 410 in a device layer 313, but they are axially oriented (e.g., along the Z-axis) such that bridge 450 is on the X-axis (FIG. 4E), while bridge 451 is on the Y-axis (FIG. 4F). As such, the trenches or voids are not axially aligned. Such trenches may be referred-to as being axially offset from one another.

FIG. 5A schematically illustrates an encapsulated MEMS sensor 500. For illustrative purposes, sensor 500 includes a MEMS device schematically illustrated as device 100, but alternate embodiments could include any of a variety of MEMS devices, such as any of the embodiments described herein.

The encapsulated sensor 500 includes a lead frame 501 having a paddle 502 and leads 503. Each of the leads 503 is electrically isolated from the paddle 502.

The MEMS device 100 is physically coupled to the paddle portion 502 of the lead frame 501, and is electrically coupled to the leads 503 by one or more wirebonds 509. The integrated device 100, paddle 502, one or more wirebonds 509, and a portion of each lead 503 are encapsulated in encapsulant 507. The packaged sensor 500 may be mounted to a substrate 508 via leads 503 extending to the outside of the encapsulant 507.

The material properties of the encapsulant (i.e., mold compound) (for example, EME_G700) such as Young's modulus and coefficient of thermal expansion (CTE) vary largely with the temperature. The Young's modulus of the mold compound changes more than 2 orders of magnitude over the temperature of −50 C to 150 C. Specifically, it changes from being a stiff material (E=240 GPa) in low temperatures (−50 C to 25 C) to a soft material (E=0.8 GPa) above 100 C. Also, its CTE changes more than three times over this temperature range (from 12e-6/C to 38e-6/C) and it is greatly higher than the CIE of Silicon (2e-6/C). As a result, large thermal stresses are generated and transferred to the MEMS sensors. This will create large sensitivity drift in the MEMS sensor over the temperature range of 175 C to −40 C. This issue is more pronounced in the MEMS sensors based on the capacitive transductions and it is vital to address this issue for the sensors having capacitive gaps of less than or equal to 1 μm.

An alternate embodiment is schematically illustrated in FIG. 5B, and is similar to the embodiment of FIG. 5A. However, the embodiment 550 of FIG. 5B includes an optional ASIC integrated circuit 551 between the paddle 502 and the back-cap 240. A lead frame and/or an ASIC 551 may be referred-to as a "base" for the MEMS device.

Figure 6:
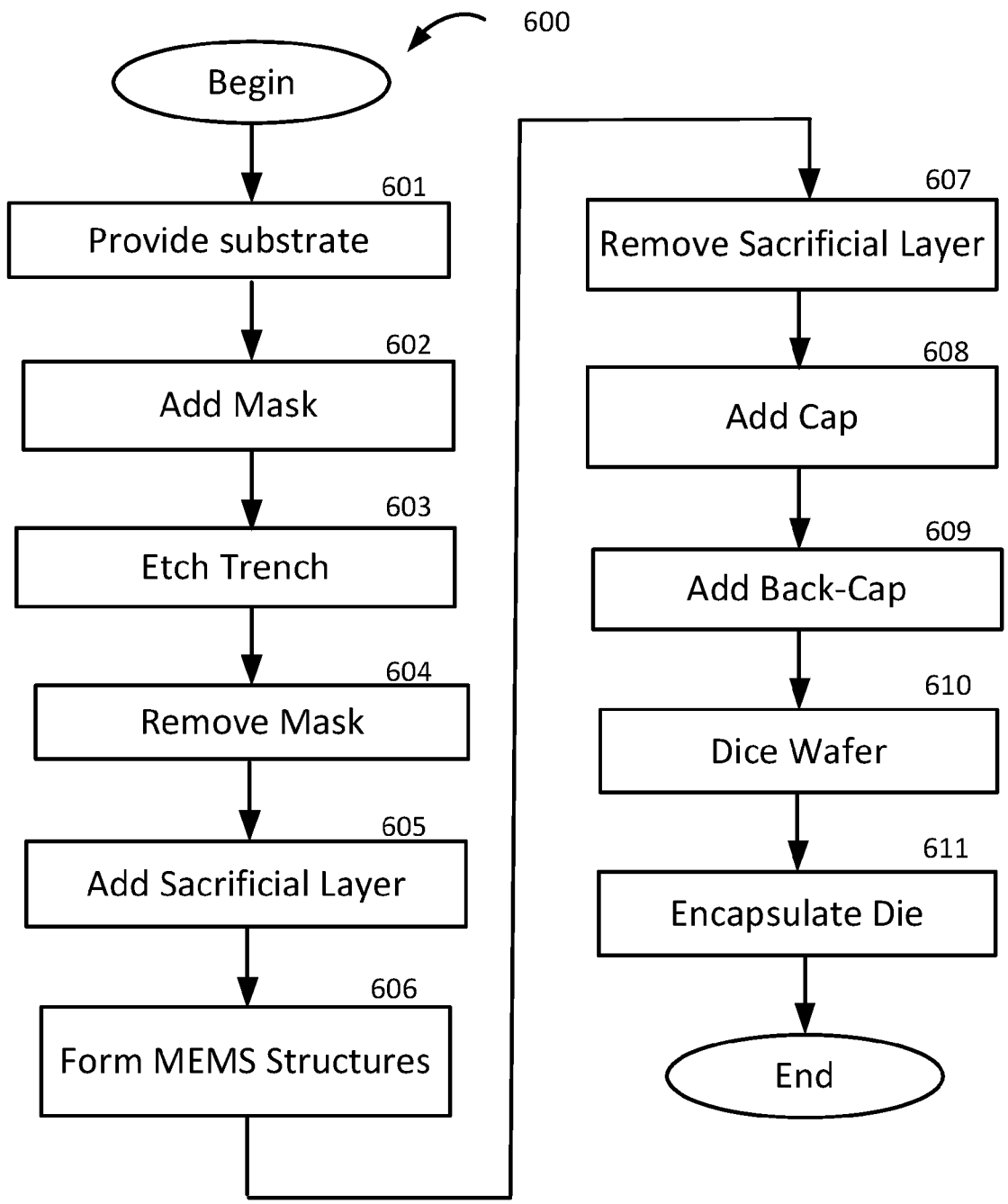
FIG. 6 illustrates a process of fabricating a MEMS device with stress-relief trenches.

A method 600 of fabricating a chip or wafer with a stress-relief trench is illustrated in FIG. 6, and a device at various stages of fabrication is schematically illustrated in FIGS. 7A-7G. Although the method 600 illustrates the fabrication of a trench 210 in a substrate 102, the same method could be employed to fabricate a stress-relief trench in an SOI substrate (e.g., substrate 301), such as in a device layer 313 or in the handle layer (e.g., trench 412 in handle layer 311) of an SOI substrate 301. However, for ease of illustration, the method 600 is illustrated as applied to a wafer substrate 102.

The method 600 begins with a substrate 102 (step 601, FIG. 7A). Next, a mask layer 701 is applied to the surface 106 of the substrate 102 (FIG. 7B), and patterned to expose the substrate 102 through one or more apertures 702 in future trench locations (step 602; FIG. 7C).

At step 603, one or more trenches 210 are etched into the substrate 102 by exposing the substrate 102 to an etchant through the apertures 702 in the mask layer 701 (FIG. 7D). Subsequently, mask layer 701 is removed (step 604, FIG. 7E). The substrate 102 not includes the stress-relieve trenches 210.

Next, a sacrificial layer 710, such as an oxide, for example, is deposited on the substrate 102, and covers the surface 106 of the substrate 102, and fills the trenches 210 (step 605, FIG. 7F). Subsequently, the MEMS structures are formed at step 606 (FIG. 7F), by methods known in the art.

Then, the sacrificial layer 710 is removed, to release the MEMS structures and remove the sacrificial material 710 from the trenches 210 (step 607, FIG. 7G.

At step 608, a cap 201 is sealed to the surface 106 of substrate 102, as schematically illustrated in FIG. 2A, for example. Optionally, a back-cap 240 may be affixed to the back surface 106B of substrate 102 at step 709 (FIG. 2A).

Then, if the device is part of a wafer, such as a wafer including many such devices, the wafer may be diced to singulate the devices into individual units at step 610. Finally, the device is encapsulated in a fluid encapsulant (or mold compound), at step 611 (see, e.g., FIG. 5). For example, the device (optionally, with a lead frame and/or an ASIC) may be held in a mold, while fluid encapsulant is injected into the mold. When the encapsulant has hardened, the encapsulated device may be removed from the mold.

Stress-relief trenches 412 in the handle layer of an SOI wafer 301 may be formed by applying steps 602 to 604 to the handle layer 311 of the SOI wafer 301.

Voids in a box layer 312 may be formed as part of the process of fabricating the SOI wafer. For example, an SOI wafer is typically formed by fabricating a handle-layer wafer (e.g., 311) and a device-layer wafer (e.g., 313), and then joining them by providing an oxide layer 312 on either the handle-layer wafer (311) or the device-layer wafer (313), and joining the handle-layer wafer (311) and the device-layer wafer (313) such that the box layer 312 is sandwiched between them. Voids, such as void 411 for example, may be formed in the box layer 312 prior to joining the handle-layer wafer (311) to the device-layer wafer (313). As such, an SOI wafer with voids 411 could be pre-fabricated and provided at step 601, for example.

As illustrated in various embodiments herein, in order to avoid or mitigate stress issues, isolation trenches are added to MEMS device, such as on both on the device and handle layers of SOI wafers inside the capped area. These isolation trenches are excluded from the interconnect path location and support areas to ensure enough mechanical support for the MEMS die. Indeed, this represents a key role for narrow capacitive gap sizes of, for example, less than or equal to 1 um. Packaged MEMS sensors along with ASIC dies in overmold packages were modeled and simulated by the inventors both with and without the isolation trenches. The simulation result shows that adding isolation trenches reduces the capacitive gap variation more than 60% over the temperature range of 175 C to −40 C. This prevents the gaps closing (pull-in) and more importantly reduces the sensitivity drift of these devices over the temperatures to less than 1%.

Definitions. As used in this description and the accompanying claims, the following terms shall have the meanings indicated, unless the context otherwise requires:

A "beam" or "proof mass" is a released MEMS structure that, when in operation, is movable with respect to a substrate. During fabrication of a MEMS device, a beam or proof mass may be secured to a substrate or other portion of the MEMS device, such that the beam or proof mass is fixed with respect to that substrate or other portion of the MEMS device.

A "stress-relief trench" is a cavity extending from a surface of a substrate and defining a void within the substrate. A stress-relief trench may have a variety of profiles (i.e., in a plane normal to the surface of the substrate). For example, a stress-relief trench may have sidewalls perpendicular to the surface of the substrate, and a bottom portion in a plane parallel to, but offset from, the surface of the substrate. In one embodiment, a trench has a rectangular profile with two opposing sidewalls and a bottom portion, and an aspect ratio of 10:1 (depth to width). In other embodiments, a stress relief trench may have intersecting sidewalls that form a "V" shaped profile. In preferred embodiments, the stress relief trench is a void, and does not contain any material other than ambient gas, or a vacuum.

A "box trench" in a substrate having an intermediate insulator layer (such as a buried oxide layer, for example) sandwiched between a top layer (e.g., a device layer) and a bottom layer (e.g., a handle layer) is a trench that extends through the intermediate layer from the top layer to the bottom layer. In some embodiments, a box trench may be in fluid communication with one or more other trenches, such as a stress-relief trench for example. In preferred embodiments, a box trench is a void, and does not contain any material other than ambient gas, or a vacuum.

A "handle trench" in a substrate having an intermediate insulator layer (such as a buried oxide layer, for example) sandwiched between a top layer (e.g., a device layer) and a bottom layer (e.g., a handle layer) is a trench that extends through the bottom layer from the intermediate layer to an opposing surface of the bottom layer. In some embodiments, a handle trench may be in fluid communication with one or more other trenches, such as a box trench for example. In preferred embodiments, the handle trench is a void, and does not contain any material other than ambient gas, or a vacuum.

Two voids (or two portions of a single void) are in "fluid communication" when a fluid could flow between them without passing through an intervening barrier.

To "encapsulate" a device is to surround the device with an encapsulant that is fluid at the time of encapsulation. In some embodiments, a step of encapsulating a device may leave a portion of the device exposed at a boundary of the encapsulant.

The embodiments of the invention described above are intended to be merely exemplary; numerous variations and modifications will be apparent to those skilled in the art. All such variations and modifications are intended to be within the scope of the present invention as defined in any appended claims.

What is claimed is:

1. An apparatus that includes a micro-electro-mechanical system (MEMS) structure and trenches to relieve stress on the MEMS structure comprising:
    a substrate having a top surface and a backside surface, the top surface including a MEMS region and a peripheral region surrounding the MEMS region;
    a MEMS structure supported by the top surface of the MEMS region;
    a top cap coupled to the top surface of the substrate creating a seal and enclosing the MEMS structure; and a plurality of trenches in the top surface of the substrate between the MEMS region and where the top cap couples to the substrate, the plurality of trenches arranged such that the trenches collectively surround the MEMS region in all radial directions relative to the top surface of the substrate, the trenches further defining at least one bridge region in the substrate from the peripheral region to the MEMS region.

2. The apparatus of claim 1, wherein at least one trench passes completely through the substrate from the top surface to the backside surface.

3. The apparatus of claim 1, further comprising a backside cap coupled to the backside surface.

4. The apparatus of claim 1, wherein the plurality of trenches in the top surface comprises:
a first set of trenches arranged along or tangential to an outer circle having a first radius; and
a second set of trenches arranged along or tangential to an inner circle having a second radius, wherein the first radius is larger than the second radius.

5. The apparatus of claim 1, further comprising:
an insulator layer supported by the top surface of the substrate;
a MEMS layer supported by the insulator layer, wherein the MEMS structure is part of the MEMS layer; and
at least one trench in the top surface of the substrate extending through the insulator layer and the MEMS layer.

6. The apparatus of claim 1, further comprising:
an insulator layer supported by the top surface of the substrate;
a MEMS layer supported by the insulator layer, wherein the MEMS structure is part of the MEMS layer; and
a trench extending through the MEMS layer and the insulator layer to the top surface of the substrate, wherein the trench extending through the MEMS layer and the insulator layer does not align with any of the plurality of trenches in the top surface of the substrate.

7. The apparatus of claim 1, wherein the substrate is a silicon-on-insulator substrate having a top layer including the top surface, an insulator layer underlying the top layer, and a bottom layer underlying the insulator layer and including the backside surface, and wherein at least one trench passes completely through the top layer to the insulator layer.

8. The apparatus of claim 1, wherein the substrate is a silicon-on-insulator substrate having a top layer including the top surface, an insulator layer underlying the top layer, and a bottom layer underlying the insulator layer and including the backside surface, the bottom layer including a plurality of trenches that do not align with the plurality of trenches in the top surface of the substrate.

9. The apparatus of claim 1, wherein the MEMS structure is a MEMS accelerometer.

10. The apparatus of claim 1, wherein the cap is enclosed in an overmold package.

11. An apparatus that includes a means for providing a micro-electro-mechanical system (MEMS) and a means for relieving stress comprising:
a substrate having a top surface and a backside surface, the top surface including a MEMS region and a peripheral region surrounding the MEMS regions;
a MEMS supported by the top surface of the MEMS region;
means for enclosing the MEMS region including the MEMS; and
means for relieving stress in the substrate arranged within the means for enclosing the MEMS and surrounding the MEMS region in all radial directions relative to the top surface of the substrate, the means for relieving stress including means for bridging the peripheral region to the MEMS region.

12. The apparatus of claim 11, wherein the means for relieving stress passes through the substrate.

13. The apparatus of claim 11, further comprising a second means for enclosing coupled to the backside surface.

14. The apparatus of claim 11, wherein the means for relieving stress comprises:
first means arranged relative to an outer circle having a first radius; and
second means arranged along an inner circle having a second radius, wherein the first radius is larger than the second radius.

15. The apparatus of claim 14, further comprising:
an insulator layer supported by the top surface of the substrate;
a MEMS layer supported by the insulator layer, wherein the MEMS is part of the MEMS layer; and
means for relieving stress in the MEMS layer.

16. The apparatus of claim 11, wherein the substrate is a silicon-on-insulator substrate having a top layer including the top surface, an insulator layer underlying the top layer, and a bottom layer underlying the insulator layer and including the backside surface, and wherein the means for relieving stress includes means for relieving stress in both the top layer and the bottom layer.

17. An apparatus that includes a micro-electro-mechanical system (MEMS) structure and trenches to relieve stress on the MEMS structure comprising:
a substrate having a top surface and a backside surface, the top surface including a MEMS region and a peripheral region surrounding the MEMS region;
a MEMS structure supported by the top surface of the MEMS region; and
at least one trench in the top surface of the substrate between the MEMS region and the peripheral region, the at least one trench arranged such that the MEMS region is surrounded by the at least one trench in all radial directions relative to the top surface of the substrate, the at least one trench further defining at least one bridge region in the substrate from the peripheral region to the MEMS region.

18. The apparatus of claim 17, wherein at least one trench passes completely through the substrate from the top surface to the backside surface.

19. The apparatus of claim 17, wherein the at least one trench comprises:
a first set of trenches arranged along or tangential to an outer circle having a first radius; and
a second set of trenches arranged along or tangential to an inner circle having a second radius, wherein the first radius is larger than the second radius.

20. The apparatus of claim 17, wherein the substrate is a silicon-on-insulator substrate having a top layer including the top surface, an insulator layer underlying the top layer, and a bottom layer underlying the insulator layer and including the backside surface, and wherein at least one trench passes completely through the top layer to the insulator layer.

21. The apparatus of claim 17, wherein the substrate is a silicon-on-insulator substrate having a top layer including the top surface, an insulator layer underlying the top layer, and a bottom layer underlying the insulator layer and including the backside surface, the bottom layer including at least one trench in the bottom layer that does not align with the at least one trench in the top surface of the substrate.

\* \* \* \* \*